United States Patent [19]

Davies et al.

[11] Patent Number: 5,343,153
[45] Date of Patent: Aug. 30, 1994

[54] WELL LOGGING METHOD AND APPARATUS USING PASSIVE AZIMUTHAL ELECTRODES

[75] Inventors: Dylan H. Davies, Viroflay; Pierre-Marie Petit, Saint-Thibault des Vignes, both of France

[73] Assignee: Schlumberger Technology Corporation, New York, N.Y.

[21] Appl. No.: 52

[22] Filed: Jan. 4, 1993

[30] Foreign Application Priority Data

Jan. 14, 1992 [FR] France ............................. 92 00283

[51] Int. Cl.$^5$ ............................................. G01V 3/20
[52] U.S. Cl. ..................................... 324/366; 324/373; 324/375
[58] Field of Search ......... 324/355, 366, 371, 373–375

[56] References Cited

U.S. PATENT DOCUMENTS

| | | | |
|---|---|---|---|
| 2,812,490 | 11/1957 | Ferre | 324/366 X |
| 2,937,333 | 5/1960 | Boucherot | 324/366 |
| 3,054,046 | 9/1962 | Holmes et al. | 324/373 |
| 3,772,589 | 11/1993 | Scholberg | 324/10 |
| 4,236,113 | 11/1980 | Wiley | 324/366 |
| 5,095,273 | 5/1992 | Kennedy et al. | 324/376 |

FOREIGN PATENT DOCUMENTS

| | | | |
|---|---|---|---|
| 941014 | 1/1974 | Canada | 324/10 |
| 0243258 | 1/1988 | European Pat. Off. | G01V 3/20 |
| 2611920 | 9/1988 | France | G01V 3/20 |
| 9114701 | 11/1991 | France . | |
| 928583 | 6/1963 | United Kingdom . | |

Primary Examiner—Gerard R. Strecker
Attorney, Agent, or Firm—Marc D. Foodman; Leonard W. Pojunas

[57] ABSTRACT

The invention relates to a logging method and apparatus using passive azimuthal electrodes. The apparatus includes an array of azimuthal electrodes ($M'az_i$) that are circumferentially spaced apart from one another on a body together with two annular guard electrodes (A2) disposed on either side of the array of azimuthal electrodes ($M'az_i$). The guard electrodes (A2) emit currents. Two annular monitor electrodes (M3, M4) are associated with the annular guard electrodes (A2). The potential difference ($\Delta Vaz_i$) between the interconnected monitor electrodes (M3, M4) and each of the azimuthal electrodes ($M'az_i$) are detected. In response to the detected potential differences, output signals ($R'az_i$) representative of the resistivity of the formations in a plurality of directions around the axis of the borehole are generated. The apparatus of the invention also relates to apparatus having two alternative modes of operation, one corresponding to a passive azimuthal electrode technique and the other corresponding to a technique in which currents ($Iaz_i$) are emitted by the azimuthal electrodes.

24 Claims, 4 Drawing Sheets

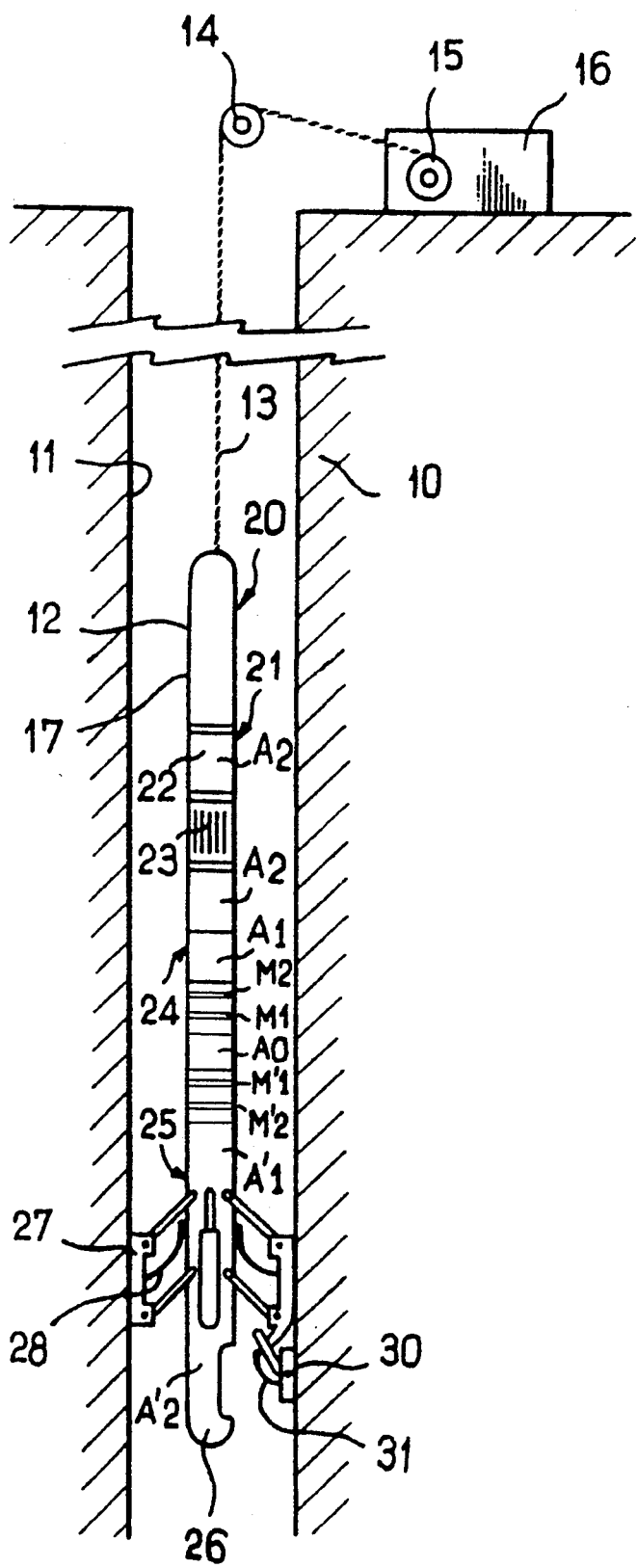
FIG_1

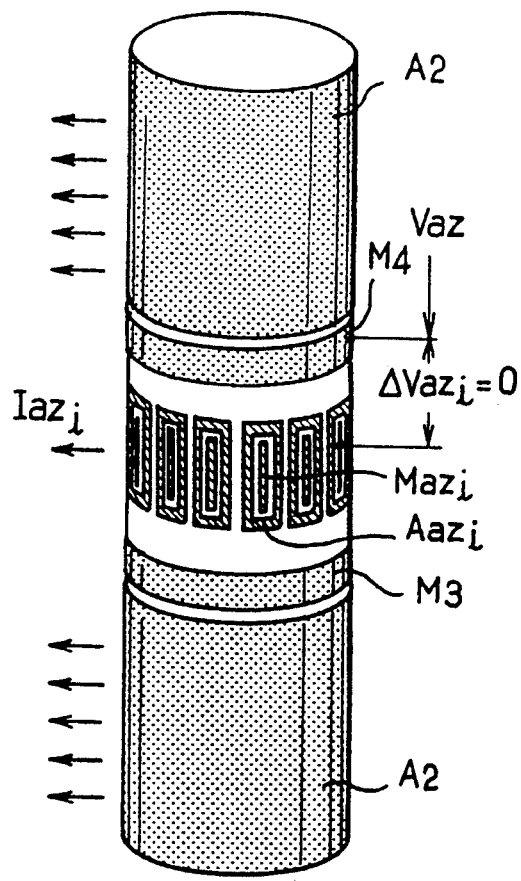
$Raz_i = k1 \cdot Vaz / Iaz_i$
FIG_2
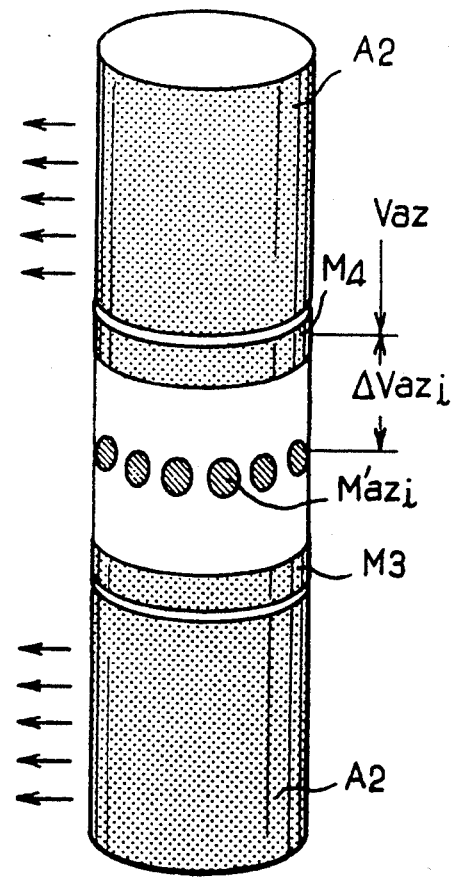
$R'az_i = c1 \cdot Vaz / \Delta Vaz_i$
FIG_3

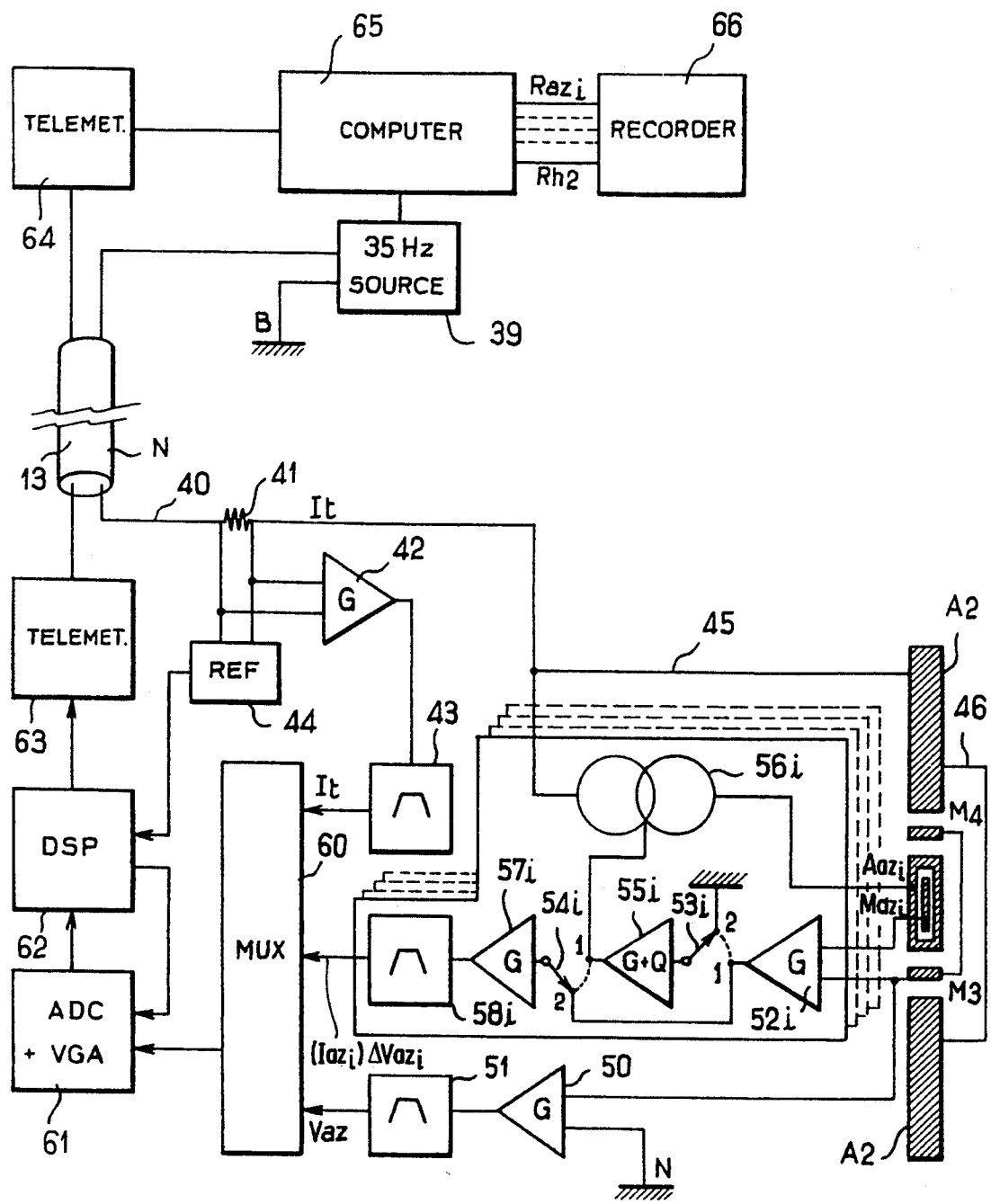
FIG_4

WELL LOGGING METHOD AND APPARATUS USING PASSIVE AZIMUTHAL ELECTRODES

BACKGROUND OF THE INVENTION

The invention relates to well logging for evaluating the resistivity of earth formations through which a borehole passes, and it relates particularly to methods and apparatuses for electrical logging using azimuthal electrodes.

Logging apparatuses are known that detect the resistivity of formations in a plurality of azimuthal directions around the axis of the borehole. For example, British patent GB 928 583 (British Petroleum Company Limited), describes an array of azimuthal electrodes that are distributed circumferentially around the periphery of a sonde. Measurement currents are emitted by the azimuthal electrodes. A guard current is emitted by a guard electrode which surrounds the azimuthal electrodes in order to focus the measurement currents.

Another logging apparatus having azimuthal electrodes is described in French patent application number 91 14701 filed Nov. 28, 1991. The sonde comprises an array of azimuthal current electrodes together with guard electrodes disposed on either side of the array of azimuthal electrodes. In addition, the sonde comprises monitor electrodes associated with the current electrodes and the guard electrodes. Servo-control loops or circuits sensitive to the potentials detected on the monitor electrodes control the measurement currents.

Under certain circumstances these techniques can give rise to problems, particularly if the emission of one of the azimuthal currents is abnormal due to faulty operation of the apparatus, which then has the effect of disturbing all of the measurements. In other cases, if the borehole fluids have high resistivity, then it is difficult to obtain accurate resistivity measurements.

An object of the invention is to provide a technique of measuring azimuthal resistivity that is relatively insensitive to instrument limitations.

Another object of the invention is to provide a logging technique using azimuthal electrodes making it possible to obtain satisfactory measurements under conditions of high-resistivity borehole fluids.

Still another object of the invention is to provide a focused electrical logging technique having two operating modes that can be selected according to circumstances.

SUMMARY OF THE INVENTION

In a first aspect of the invention, a method of evaluating the resistivity of earth formations through which a borehole passes, comprises the steps of: emitting electrical currents into the formations from longitudinally spaced apart annular current electrodes disposed on an elongate body suitable for being moved along the borehole; detecting the potentials caused by said currents on an array of circumferentially spaced apart azimuthal electrodes disposed on the body between the annular current electrodes; and, in response to said detected potentials, generating output signals representative of the resistivity of the formations in a plurality of directions around the borehole.

An apparatus for evaluating the resistivity of earth formations through which a borehole passes comprises an elongate body adapted to be displaced along the borehole, an array of circumferentially spaced apart azimuthal electrodes on the body, two annular current electrodes longitudinally disposed on the body on either side of the array of azimuthal electrodes and means for emitting electrical currents via the current electrodes. The apparatus further comprises means for detecting the potentials caused by said currents on the azimuthal electrodes and means responsive to the detected potentials to generate output signals representative of the resistivity of the formations in a plurality of directions around the borehole.

Preferably, to generate each azimuthal output signal, the ratio ($Vaz_i/\Delta Vaz_i$) is determined of the potential ($Vaz_i$) detected on two interconnected annular monitor electrodes respectively associated with the annular current electrodes, divided by the potential difference ($\Delta Vaz_i$) detected between the annular monitor electrodes and an azimuthal electrode.

In a second aspect of the invention, a method of evaluating the resistivity of earth formations through which a borehole passes, comprises two operating modes. In the first mode, the method comprises emitting measurement currents via an array of circumferentially spaced apart azimuthal electrodes disposed on an elongate body and emitting guard currents into the formations via longitudinally spaced apart annular current electrodes disposed on either side of said array of azimuthal electrodes. First output signals representative of the resistivity of the formations in a plurality of directions around the borehole are generated in response to the measurement currents. In a second mode of operation, the method comprises emitting pseudo-guard currents into the formations via said annular current electrodes, detecting the potentials caused by said pseudo-guard currents on the azimuthal electrodes and, in response to the potentials detected on the azimuthal electrodes, generating second output signals representative of the resistivity of the formations in a plurality of directions around the borehole.

An apparatus for evaluating the resistivity of earth formations through which a borehole passes comprises: an elongate body adapted to be moved along the borehole; an array of circumferentially spaced apart azimuthal electrodes disposed on the body; two annular current electrodes disposed longitudinally on the body on either side of the array of azimuthal electrodes; and means for emitting first electrical currents via the current electrodes. The apparatus comprises means for emitting measurement currents via the azimuthal electrodes and means responsive to the measurement currents for generating first output signals representative of the resistivity of the formations in a plurality of directions around the borehole in a first mode of operation. The apparatus further comprises means for detecting potentials caused by said first currents on the azimuthal electrodes and means for generating second output signals representative of the resistivity of the formations in a plurality of directions around the borehole in response to said detected potentials in a second mode of operation.

The apparatus preferably comprises two annular monitor electrodes disposed on either side of the array of azimuthal electrodes and associated with respective guard electrodes. In addition, each azimuthal electrode comprises an azimuthal current electrode and an azimuthal monitor electrode disposed in the vicinity of each other.

In the first mode of operation, the potentials appearing on the azimuthal monitor electrodes are detected, the potentials appearing on the annular monitor electrodes associated with the guard electrodes are detected, and the emission of currents is controlled in response to the detected potentials to focus the measurement currents both azimuthally and longitudinally. Each of the first azimuthal output signals is a function of the ratio ($Vaz_i/Iaz_i$) of the potential detected on the annular monitor electrodes divided by the measurement current emitted by an azimuthal electrode.

In the second mode of operation, each of the second azimuthal output signals is a function of the ratio ($Vaz_i/\Delta Vaz_i$) of the potential detected on the annular monitor electrodes divided by the potential difference detected between an azimuthal monitor electrode and the annular monitor electrodes.

BRIEF DESCRIPTION OF THE DRAWINGS

The characteristics and advantages of the invention appear more clearly from the following description given by way of non-limiting example and made with reference to the accompanying drawings, in which:

FIG. 1 shows a logging apparatus of the invention comprising a sonde having azimuthal electrodes suspended down a borehole;

FIG. 2 shows a configuration of electrodes that may be carried by the logging apparatus of FIG. 1 for implementing an azimuthal measurement technique described in above-mentioned French patent application number 91 14701;

FIG. 3 shows another configuration of electrodes for implementing an azimuthal measurement technique according to a first aspect of the invention;

FIG. 4 is a block diagram of electrical circuits usable in the FIG. 1 logging apparatus according to a second aspect of the invention to implement one or other of the two above techniques as alternatives.

DETAILED DESCRIPTION OF A PREFERRED EMBODIMENT

Figure 5:
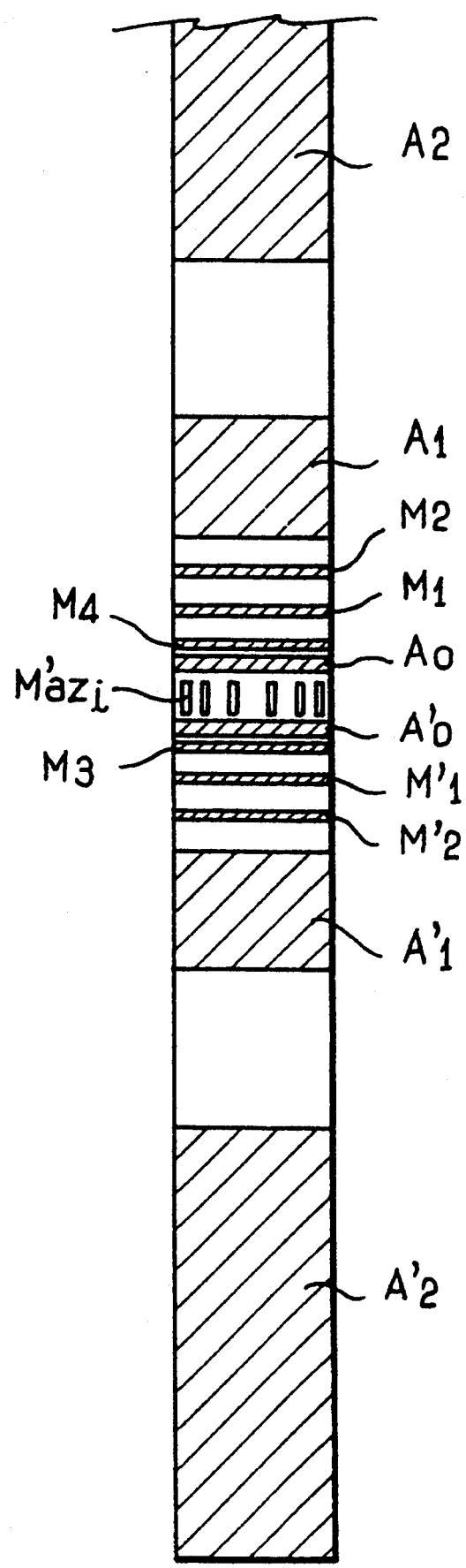
FIG. 5 shows another configuration of electrodes for implementing the azimuthal measurement technique according to the invention.

With reference to FIG. 1, a well logging apparatus for evaluating the resistivity of earth formations 10 through which a borehole 11 passes comprises a sonde 12 suspended down the borehole at the end of a multi-conductor cable 13. The cable 13 passes over a sheave 14 and is wound onto a winch 15 for moving the sonde 12 along the borehole. The winch 15 constitutes a portion of a surface unit 16.

The sonde 12 comprises four sections fixed end-to-end so as to form an elongate body 17. The top section 20 is a sealed metal case containing electrical circuits. A first intermediate section 21 comprises a tubular body 22 which carries an array 23 of circumferentially spaced apart azimuthal electrodes. A second intermediate section 24 fixed to the bottom of the first intermediate section 21 carries annular electrodes used for conventional Laterolog type measurements. A bottom section 25 comprises a metal body 26 having four centralizing pads 27 hinged thereon that are suitable for pressing against the wall of the borehole 11 under the action of spring blades 28. A measurement pad 30 hinged to the bottom end of one of the centralizing pads 27 is urged by an individual spring 31 against the wall of the borehole. The measurement pad 30 is fitted with conventional electrodes for forming a conventional type of spherically focused microresistivity measurement. The bottom section 25 may be replaced by a single elongate electrode if there is no desire to perform a microresistivity measurement.

The sonde 12 includes a first array of annular electrodes A0, M1-M'1, M2-M'2, A1-A'1, and A2-A'2 for implementing a known Dual-Laterolog technique at depth (LLd) and at shallower depth (LLs) using the technique described in U.S. Pat. No. 3 772 589 (Scholberg). In addition, the electrode A2 is made in two portions having the array 23 of azimuthal electrodes disposed therebetween for the purpose of performing resistivity measurements in a plurality of directions around the borehole.

FIG. 2 shows a configuration of electrodes for implementing an azimuthal measurement method described in above-mentioned French patent application number 91 14701.

With reference to FIG. 2 which shows the intermediate section 21 of the sonde 12, the body 22 of this section forms two guard electrodes A2 which are respectively associated with two annular monitor electrodes M3 and M4 that are electrically interconnected. The array 23 of twelve circumferentially spaced apart azimuthal electrodes is disposed between the two annular electrodes M3 and M4. Each azimuthal electrode comprises an azimuthal current electrode $Aaz_i$ surrounding an azimuthal monitor electrode $Maz_i$, where i is an index in the range 1 to 12.

To obtain resistivity measurements in a plurality of connections around the borehole, measurement currents $Iaz_i$ are emitted into the formations by the azimuthal current electrodes $Aaz_i$. These currents are focused longitudinally by guard currents emitted by the electrodes A2. A servo-control system made up of twelve servo-control loops controls the measurement currents $Iaz_i$ in such a manner as to substantially maintain at zero the potential difference $\Delta Vaz_i$ detected between the annular monitor electrodes M3 and M4 that are connected to each other, and each of the azimuthal monitor electrodes $Maz_i$. In addition, the potential Vaz of the interconnected annular monitor electrodes M3 and M4 is detected and azimuthal output signals $Raz_i$ are generated where each is a function of the ratio of the potential Vaz detected on the annular monitor electrodes divided by the current $Iaz_i$ emitted by an azimuthal electrode, as given by the equation:

$$Raz_i = kl\, Vaz/Iaz_i$$

where kl is a coefficient that depends on the geometry of the sonde. This technique gives satisfactory results in most of the conditions that are usually encountered.

FIG. 3 shows another configuration of electrodes that may be used for implementing a measurement technique to measure azimuthal resistivity according to the invention. The array of electrodes comprises twelve circumferentially spaced apart azimuthal electrodes $M'az_i$ that are disposed as in FIG. 2 between annular monitor electrodes M3 and M4 and current electrodes A2. Pseudo-guard currents are emitted by the electrodes A2 but no current is emitted by the azimuthal electrodes $M'az_i$. Potential differences $\Delta Vaz_i$ caused by the pseudo-guard currents appear between interconnected annular monitor electrodes M3 and M4 and each of the azimuthal monitor electrodes $Maz_i$. The potential Vaz of the annular monitor electrodes M3 and M4 is detected and azimuthal output signals $R'az_i$ are generated, each of which is a function of the ratio of the detected potential Vaz divided by the potential difference $\Delta Vaz_i$, as given by the following equation:

$$R'az_i = c1\ Vaz/\Delta Vaz_i$$

in which $c1 = g1\ Rm$, where $g1$ is a coefficient that depends on the geometry of the sonde and $Rm$ is the resistivity of the fluids in the borehole.

In the embodiment described, the annular monitor electrodes M3 and M4 are situated between the electrodes A2 and the array 23 of azimuthal electrodes. These monitor electrodes may also be situated inside each electrode A2 so that the top electrode A2 extends beneath the electrode M4 and the bottom electrode A2 extends above the electrode M3. It will be observed that for this passive azimuthal electrode technique there is no need to have azimuthal current electrodes. However, it is possible to use an array identical to that shown in FIG. 2. It is then possible to detect the potential difference $\Delta Vaz_i$ either on $Aaz_i$, or on $Maz_i$, or on both electrodes $Aaz_i$ and $Maz_i$.

Like the signals $Raz_i$, the signals $R'az_i$ are representative of the azimuthal resistivity of the formations. The denominator $\Delta Vaz_i$ of $R'az_i$ is the potential drop due to the pseudo-guard current coming from the guard electrode and flowing in front of the space between said guard electrode and each of the azimuthal electrodes. The potential drop $\Delta Vaz_i$ is thus a measurement of said current, which measurement is-normalized, so to speak, by dividing it by the resistivity $Rm$ of the borehole fluids.

The second azimuthal measurement technique shown on FIG. 3 is often preferable to the first technique shown on FIG. 2. Its quality does not depend on proper operation of servo-control circuits or loops for controlling the emission of measurement currents. The resistivity measurements are better if the borehole fluids have high resistivity, e.g. greater than 2 ohm.m. Finally, the resistivity measurements are not subjected to undesirable effects due to the contact impedances of the azimuthal electrodes.

Since this method of obtaining azimuthal measurements does not require focused currents, the array of azimuthal electrodes need no longer be disposed between the two electrodes A2, but may be disposed at the end of a single electrode A2.

The technique using passive azimuthal electrodes may be used to replace the technique described with reference to FIG. 2. The array 23 of electrodes shown in FIG. 2 is then replaced by the more simple array of FIG. 3 to provide a Dual Laterolog having azimuthal electrodes incorporated within electrode A2. This azimuthal technique may be used in a stand-alone configuration without Laterolog measurements LLs and LLd. Also, other combinations of LLd, LLs and azimuthal logging devices may be designed, for example by incorporating the azimuthal array of electrodes $M'az_i$ within one of the electrodes A0 or A1.

FIG. 5 shows a configuration of electrodes where the azimuthal array of electrodes $M'az_i$ is incorporated in electrode A0. The sonde body is made of an insulating material with carries from top to bottom the previously described electrodes A2, A1, M2, M1, M'1, M'2, A'1 and A'2. The difference between the configuration shown on FIG. 1 and the configuration shown on FIG. 5 is that the central current electrode previously designated A0 is made in two portions A0 and A'0 and that the array of azimuthal electrodes $M'az_i$ is located between the two portions A0 and A'0. The array of electrodes A0-A'0, M1-M'1, M2-M'2, A1-A'1 and A2-A'2 is used as described previously for implementing a Dual Laterolog technique LLd and LLs. The azimuthal electrodes $M'az_i$ and annular monitor electrodes M3, M4 are used, as described with reference to FIG. 3, to derive azimuthal resistivity output signals $R'az_i$. It will be noted that annular monitor electrodes M3, M4 are located on each side of electrodes A0, A'0.

The technique using passive azimuthal electrodes as shown in FIG. 3 is also particularly interesting in combination with the technique using azimuthal current emission as shown in FIG. 2. Under such circumstances, use is made on the sonde 12 of an array 21 of azimuthal electrodes similar to that shown in FIG. 2. Electrical circuits (not shown) are provided for performing LLd and LLs mode measurements as mentioned above. A portion of the electrical circuits, as shown in FIG. 4, serves to obtain azimuthal measurements $Raz_i$ and $R'az_i$ for implementing the above two techniques alternatively.

With reference to FIG. 4, the surface circuits are situated in the surface unit 16 and the downhole circuits are situated in the sections 20 and 21. Above-described electrodes A2, M3, M4, $Maz_i$, and $Aaz_i$ are shown diagrammatically to the bottom right of the figure, with only one electrode $Maz_i$ and only one electrode $Aaz_i$ being shown to simplify the description.

Alternating current It at a frequency of 35 Hz is sent from a source on the surface 39 to the downhole sonde via one or more conductors 40 of the cable 13. This total current It is detected downhole by means of a low-value series resistance 41 whose terminals are connected to an amplifier 42 followed by a bandpass filter 43 centered on the frequency 35 Hz. The phase of the total current It is also detected by means of a phase detector circuit 44. The downhole measurement of the total current It and the detection of its phase makes it possible to eliminate the effect of distortion that may be introduced by transmission along the cable 13. A portion of the total current is applied via a conductor 45 to the electrodes A2 which are electrically short-circuited as indicated diagrammatically by connection 46. The total current flows between the current electrodes and a remote electrode B situated on the surface.

The connected-together annular monitor electrodes M3 and M4 are connected to the input of a measurement amplifier 50 whose other input is connected to a reference electrode N which is the armoring of the cable. The output of the amplifier 50 is applied to a bandpass filter 51 centered on the frequency 35 Hz and which provides an alternating signal Vaz representative of the potential difference between the reference electrode N and the electrodes M3, M4.

Each azimuthal monitor electrode $Maz_i$ is connected to a differential input of a preamplifier $52_i$ whose other input is connected to the annular monitor electrodes M3, M4. The output of the preamplifier $52_i$ is connected to two switches $53_i$ and $54_i$ that are controlled synchronously. Switch $53_i$ is connected to the input of a high-gain amplifier stage $55_i$ which also performs the function of a 35 Hz filter, and is itself converted to a current source $56_i$ formed by a voltage to current converter. The output current from the source $56_i$ is applied between the guard electrode A2 and the azimuthal current electrode $Aaz_i$ associated with the electrode $Maz_i$ under consideration. When the switch $53_i$ is in position 1, corresponding to the first mode of operation, the loop $52_i$, $55_i$, and $56_i$ controls each azimuthal current $Iaz_i$ so as to cancel the potential difference between M3, M4 and the corresponding azimuthal monitor electrode.

When the switch $54_i$ is in position 1, the output signal from the amplifier stage $55_i$ is applied to a measurement amplifier $57_i$ followed by a bandpass filter $58_i$ centered on the frequency 35 Hz so as to provide an alternating signal. $Iaz_i$ representative of the measurement current emitted by the azimuthal electrode $Aaz_i$. As shown in dashed lines in FIG. 4, the apparatus includes twelve identical channels supplying the measurement currents $Iaz_i$.

When the switch $53_i$ is in position 2 corresponding to the second mode of operation, the input of the amplifier stage $55_i$ is grounded so that no current is supplied by the current source $56_i$. In addition, the switch $54_i$ is in its position 2 where it connects the output of the preamplifier $52_i$ to the input of the measurement amplifier $57_i$ which then provides an alternating signal $\Delta Vaz_i$ to the output of the filter $58_i$, which signal is representative of the potential difference between the azimuthal electrodes $Maz_i$ and M3, M4. The signals Vaz, It, and the twelve signals $Iaz_i$ (or $\Delta Vaz_i$) are applied to a multiplexer 60 whose output is applied to an analog-to-digital converter 61 which includes a variable gain input amplifier. The digital outputs from the converter 61 are applied to a digital processor circuit 62 constituted by a digital signal processor (DSP) programmed to perform a phase-synchronized rectifier or phase-sensitive detector function and a lowpass filter function. The phase reference required by the rectifier function comes from the circuit 44 so as to be synchronized with the total downhole current It. The processor circuit 62 also supplies a control signal to the variable gain amplifier of the analog-to-digital converter 61 so as to reduce the dynamic range of the input signals to the converter.

The multiplexed digital signals represent the amplitudes of currents or voltages Vaz, It, and $Iaz_i$ in the first operating mode, or Vaz, It, and $\Delta Vaz_i$ in the second operating mode, and they are applied to telemetry circuits 63 suitable for modulating and transmitting such signals to the surface via the cable 13.

As shown in FIG. 4, the downhole signals are received and demodulated on the surface by a telemetry circuit 64 and they are then input into a computer 65 which may be constituted, by example, by a Microvax microcomputer as sold by Digital Equipment Corporation. The computer 65 demultiplexes the signals Vaz, It, and $Iaz_i$ (or $\Delta Vaz_i$) and depending on the operating mode it calculates signals for the resistivity of the formations $Raz_i$ and Rhr or $R'az_i$ and R'hr using the following equations:

$$Raz_i = k1\ Vaz/Iaz_i$$

$$Rhr = k2\ Vaz/\Sigma Iaz_i \text{ or}$$

$$R'az_i = g1\ Rm\ Vaz/\Delta Vaz_i$$

$$R'hr = g2\ Rm\ Vaz/\Sigma\Delta Vaz_i$$

in which k1, k2, g1 and g2 are predetermined constants that depend on the geometry of the downhole sonde. Rm is the resistivity of the borehole fluids as estimated or measured separately.

Rhr and R'hr which corresponds to means of the conductivities $1/Raz_i$ or $1/R'az_i$ are measurements of the resistivity of the formations with high longitudinal resolution. The various resistivity signals are recorded as a function of depth in recording apparatus 66 which may include an optical recorder and a magnetic recorder.

The circuits described above make it possible to obtain azimuthal resistivity measurements using both the techniques of FIGS. 2 and 3 alternatively. The person skilled in the art can easily derive the circuits required for implementing the technique of FIG. 3 on its own, merely by omitting those portions of the circuits that are used exclusively for the measurements described with reference to FIG. 2, such as the circuits used for emitting azimuthal currents and the switches for switching from one technique to the other.

The embodiments described above may naturally be varied or improved in numerous ways while remaining within the scope of the invention as defined in the following claims. In particular, both types of measurement may be performed simultaneously by emitting currents at different frequencies for measuring $Raz_i$ and $R'az_i$.

We claim:

1. A method for evaluating the resistivity of earth formations through which a borehole passes, the method comprising the steps of:

lowering into the borehole an elongate body having electrodes disposed thereon, said electrodes comprising longitudinally spaced apart annular current electrodes and an array of circumferentially spaced apart azimuthal electrodes disposed between said annular current electrodes.

emitting electrical currents into the formations between said annular current electrodes and a remote return electrode;

detecting potentials caused by said currents on said azimuthal electrodes with respect to an electrode longitudinally spaced apart on said body from said azimuthal electrodes; and generating output signals representative of the resistivity of the formations in a plurality of directions around the borehole in response to said potentials detected on the azimuthal electrodes.

2. The method according to claim 1, in which the step of generating output signals comprises the steps of:

detecting potentials on two interconnected annular monitor electrodes respectively adjacent to the annular current electrodes with respect to a remote reference electrode;

detecting the potential differences between the annular monitor electrodes and each of the azimuthal electrodes; and determining a function of the ratio of the detected potential divided by the potential difference detected on each of said azimuthal electrodes to derive each of a plurality of azimuthal resistivity signals.

3. The method according to claim 2, further comprising the step of generating a mean output signal which is a function of said plurality of azimuthal resistivity signals.

4. Apparatus for evaluating the resistivity of earth formations through which a borehole passes, the apparatus comprising:

an elongate body adapted to be displaced along the borehole;

an array of circumferentially spaced apart azimuthal electrodes disposed on the body;

two annular current electrodes longitudinally disposed on the body on either side of said array of azimuthal electrodes;

a return electrode remotely disposed from said annular current electrodes;

means for emitting electrical currents between the current electrodes and the return electrode;

means for detecting the potentials caused by said currents on said azimuthal electrodes with respect to an electrode longitudinally spaced apart on said body from said azimuthal electrodes; and means responsive to said detected potentials to generate output signals representative of the resistivity of the formations in a plurality of directions around the borehole.

5. The apparatus according to claim 4, further comprising two annular monitor electrodes respectively adjacent to the annular current electrodes and disposed on either side of the array of azimuthal electrodes.

6. The apparatus according to claim 5, wherein the means for generating the output signals comprise:

means for detecting the potential on said interconnected annular monitor electrodes with respect to a remote reference electrode;

means for detecting the potential differences between said annular monitor electrodes and each of the azimuthal electrodes; and means for generating a plurality of azimuthal resistivity signals each of which is a function of the ratio of said detected potential divided by the potential difference detected on one of said azimuthal electrodes.

7. The apparatus according to claim 6, further comprising means for generating a mean output signal which is a function of said plurality of azimuthal resistivity signals.

8. A method of evaluating the resistivity of earth formations through which a borehole passes, the method comprising the steps of:

lowering into the borehole an elongate body having longitudinally spaced apart annular current electrodes and an array of circumferentially spaced apart azimuthal electrodes disposed on the body between the annular current electrodes;

in a first mode of operation, emitting measurement currents into the formations between said azimuthal electrodes and a remote return electrode, emitting guard currents into the formations via said annular current electrodes to focus said measurement currents, and generating first output signals representative of the resistivity of the formations in a plurality of directions around the borehole in response to said measurement currents; and in a second mode of operation,
emitting pseudo-guard currents into the formations between said annular current electrodes and said return electrode, detecting potentials caused by said pseudo-guard currents on said azimuthal electrodes with respect to an electrode longitudinally spaced apart on said body from said azimuthal electrodes, and generating second output signals representative of the resistivity of the formations in a plurality of directions around the borehole in response to said detected potentials.

9. The method according to claim 8, wherein each azimuthal electrode comprises an azimuthal current electrode and an azimuthal monitor electrode and wherein an annular monitor electrode is respectively adjacent to each of said annular current electrode, the method further comprising the following steps in the first mode of operation:

detecting the potential differences between the azimuthal monitor electrodes and interconnected annular monitor electrodes; and controlling the emission of currents in response to the detected potential differences to focus the measurement currents longitudinally and azimuthally.

10. The method according to claim 9, wherein the step of controlling the currents comprises the step of:

controlling the current emitted by each of the azimuthal current electrodes to maintain said detected potential difference at zero.

11. The method according to claim 9, wherein the step of generating first output signals comprises the steps of:

detecting the potential on said interconnected annular monitor electrodes;

detecting the measurement currents emitted by the azimuthal current electrodes; and generating first azimuthal resistivity signals each of which is a function of the ratio of the detected potential divided by the detected measurement current.

12. The method according to claim 9, wherein the step of generating the second output signals comprises the steps of:

detecting the potential on said interconnected annular monitor electrodes with respect to an electrode longitudinally spaced apart on said body from said azimuthal electrodes;

detecting the potential differences between the azimuthal monitor electrodes and the annular monitor electrodes; and generating second azimuthal resistivity signals each of which is a function of the ratio of the detected potential divided by the detected potential difference.

13. Apparatus for evaluating the resistivity of earth formations through which a borehole passes, the apparatus comprising:

an elongate body adapted to be moved along the borehole;

an array of circumferentially spaced apart azimuthal electrodes disposed on the body;

two annular current electrodes disposed longitudinally on the body on either side of the array of azimuthal electrodes;

a return electrode remotely disposed from said annular current electrodes;

means for emitting (i) measurement currents between the azimuthal electrodes and said return electrode and (ii) guard currents between the annular current electrodes and said return electrode in a first mode of operation, and for emitting pseudo-guard currents between the annular current electrodes and said return electrode in a second mode of operation;

means responsive to the measurement currents for generating first output signals representative of the resistivity of the formations in a plurality of directions around the borehole in said first mode of operation;

means for detecting potentials caused by said pseudo-guard currents on said azimuthal electrodes with respect to an electrode longitudinally spaced apart on said body from said azimuthal electrodes in said second mode of operation; and means responsive to said detected potentials for generating second output signals representative of the resistivity of the formations in a plurality of directions around the borehole in said second mode of operation.

14. The apparatus according to claim 13, further comprising two annular monitor electrodes disposed on either side of the array of azimuthal electrodes and respectively adjacent to the annular current electrodes.

15. The apparatus according to claim 14, wherein each azimuthal electrode comprises an azimuthal current electrode and an azimuthal monitor electrode disposed on the body in the vicinity of each other.

16. The apparatus according to claim 15, further comprising:

means for detecting the potential on the interconnected annular monitor electrodes with respect to a remote reference electrode; and means for detecting the potential differences between the azimuthal monitor electrodes and the interconnected annular monitor electrodes.

17. The apparatus according to claim 16, further comprising:

means for controlling, in the first mode of operation, the emission of said measurement currents in response to the detected potential differences in order to focus the measurement currents longitudinally and azimuthally; and means for deactivating said means for controlling the emission of measurement currents in the second mode of operation.

18. The apparatus according to claim 17, further comprising processor circuits disconnectably connected to said means for controlling the emission of currents to produce, in the first mode of operation, signals that are representative of the measurement currents.

19. The apparatus according to claim 18, further comprising means for disconnecting, in the second mode of operation, said processor circuits from said means for controlling the emission of currents, and for connecting means for detecting the potential differences thereto so that said processor circuits produce signals representative of said potential differences.

20. The apparatus according to claim 16, wherein said means for generating the first output signals comprise means for determining the ratio of the detected potential divided by the measurement current to derive each first output signal.

21. The apparatus according to claim 16, wherein said means for generating the second output signals comprise means for determining a function of the ratio of said detected potential divided by said detected potential difference to derive each second output signal.

22. Apparatus for evaluating the resistivity of earth formations through which a borehole passes, the apparatus comprising:

an elongate body adapted to be displaced along the borehole;

a pair of interconnected longitudinally spaced annular current electrodes disposed on the body;

a return electrode remotely disposed from said annular current electrodes;

annular guard electrodes disposed on the body on opposite sides of said pair of annular current electrodes;

an array of circumferentially spaced-apart azimuthal electrodes disposed between said annular current electrodes;

means for emitting an electrical measurement current between said annular current electrodes and said return electrode;

means for emitting focusing currents between the guard electrodes and said return electrode;

means responsive to said measurement current to generate a first output signal representative of the resistivity of the formations;

means for detecting potentials caused by said measurement current on said azimuthal electrodes with respect to an electrode longitudinally spaced apart on said body from said azimuthal electrodes; and means responsive to said detected potentials for generating second output signals representative of the resistivity of the formations in a plurality of directions around the borehole.

23. The apparatus according to claim 22, further comprising:

a pair of interconnected annular monitor electrodes respectively associated with said annular current electrodes and disposed on either side of the array of azimuthal electrodes;

means for detecting the potential on said interconnected annular monitor electrodes with respect to a remote reference electrode;

means for detecting the potential differences between said annular monitor electrodes and each of the azimuthal electrodes;

said means for generating the second output signals comprising means for generating a plurality of azimuthal resistivity signals each of which is a function of the ratio of said detected potential divided by the potential difference detected on one of said azimuthal electrodes.

24. The apparatus according to claims 23, further comprising means for generating a mean output signal which is a function of said plurality of azimuthal resistivity signals.

* * * * *